United States Patent
Wu et al.

(10) Patent No.: US 11,222,845 B2
(45) Date of Patent: Jan. 11, 2022

(54) SEMICONDUCTOR DEVICE PACKAGE

(71) Applicant: Advanced Semiconductor Engineering, Inc., Kaohsiung (TW)

(72) Inventors: Po-I Wu, Kaohsiung (TW); Chen-Chao Wang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 76 days.

(21) Appl. No.: 16/593,884

(22) Filed: Oct. 4, 2019

(65) Prior Publication Data

US 2021/0104461 A1   Apr. 8, 2021

(51) Int. Cl.
*H01L 23/52* (2006.01)
*H01L 23/528* (2006.01)

(52) U.S. Cl.
CPC ...... *H01L 23/5283* (2013.01); *H01L 23/5286* (2013.01)

(58) Field of Classification Search
CPC .................. H01L 23/5286; H01L 2223/6683
See application file for complete search history.

(56) References Cited

U.S. PATENT DOCUMENTS

| | | | | |
|---|---|---|---|---|
| 2010/0214041 A1* | 8/2010 | Cho | ................. | H01L 23/66 333/238 |
| 2010/0225425 A1* | 9/2010 | Cho | ................. | H01P 1/2013 333/238 |
| 2010/0244274 A1* | 9/2010 | Ishitsuka | ................. | H01L 23/49816 257/774 |
| 2016/0174374 A1* | 6/2016 | Kong | ................. | H01L 23/49822 174/262 |
| 2017/0365515 A1* | 12/2017 | Kuo | ................. | H01L 23/5286 |
| 2019/0304896 A1* | 10/2019 | Then | ................. | H01L 21/764 |
| 2020/0312759 A1* | 10/2020 | Collins | ................. | H01L 23/49822 |

* cited by examiner

*Primary Examiner* — Benjamin P Sandvik
(74) *Attorney, Agent, or Firm* — Foley & Lardner LLP

(57) ABSTRACT

A semiconductor device includes a dielectric layer, a first conductive layer penetrating the dielectric layer, and a grounding structure disposed within the dielectric layer and adjacent to the first conductive layer. The dielectric layer has a first surface and a second surface opposite the first surface. The first conductive layer has a first portion and a second portion connected to the first portion. The first portion has a width greater than that of the second portion.

19 Claims, 18 Drawing Sheets

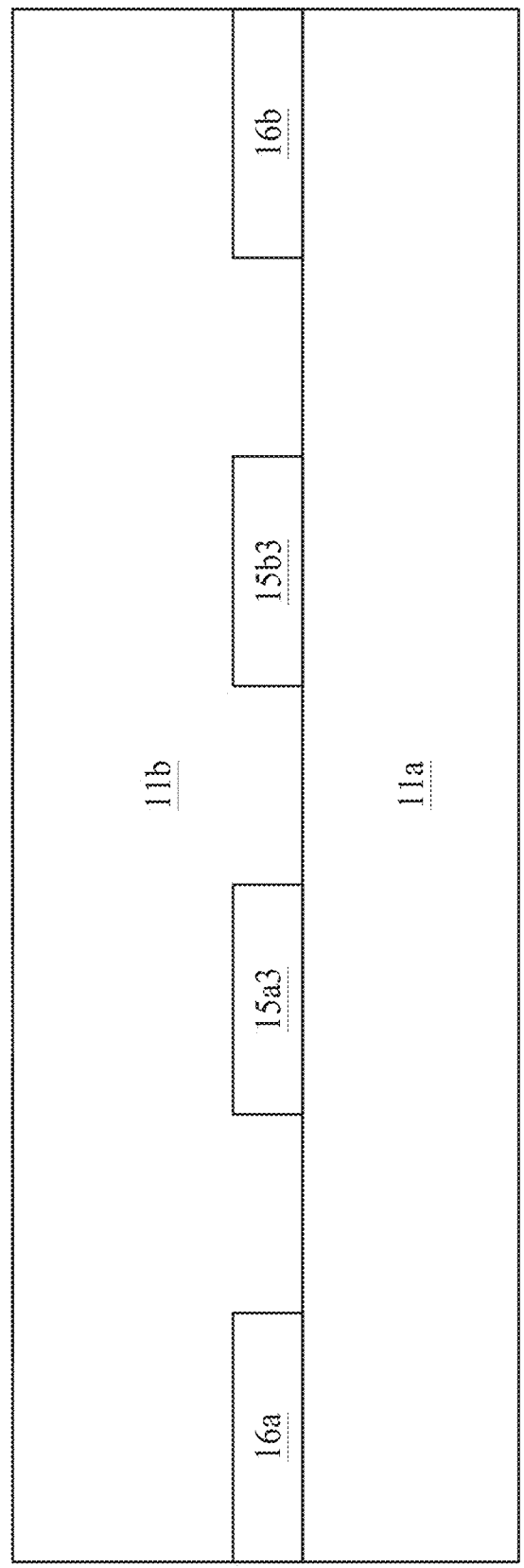

SEMICONDUCTOR DEVICE PACKAGE

BACKGROUND

1. Technical Field

The present disclosure generally relates to a semiconductor device package, and to a semiconductor device package having an interconnection structure.

2. Description of the Related Art

Electronic package trends toward compact/thin package profile and high reliability. The packaging techniques for the aforesaid electronic package include Flip Chip Ball Grid Array (FCBGA) and Fan-out wafer-level packaging (Fan-out packaging), among others. Compared to Fan-out packaging, FCBGA possesses lower conduction loss (and thus possesses higher reliability) but is thicker (e.g., thicker than 1800 micrometer (μm)) and the line/space (L/S) width thereof is greater (e.g., L/S width equal to or greater than 25 μm/25 μm). Fan-out packaging, on the other hand, is thinner (e.g., thinner than 600 micrometer (μm)) and can possess high density fine-pitch connection (e.g., L/S width equal to or less than 5 μm/5 μm) to accommodate more I/O pins. However, fine line with a narrow width may cause higher direct current (DC) conduction loss (e.g., insertion loss). Lastly, in the final package product, the insertion loss can cause signal distortion and generate reliability problem.

SUMMARY

In one or more embodiments, a semiconductor device package includes a dielectric layer, a first conductive layer penetrating the dielectric layer, and a grounding structure disposed within the dielectric layer and adjacent to the first conductive layer. The dielectric layer has a first surface and a second surface opposite the first surface. The first conductive layer has a first portion and a second portion connected to the first portion. The first portion has a width greater than that of the second portion.

In one or more embodiments, a semiconductor device package includes a dielectric layer, a first conductive layer, an electronic component disposed over the dielectric layer, and a first grounding structure disposed within the dielectric layer and adjacent to the first conductive layer. The dielectric layer has a first surface and a second surface opposite the first surface. The first conductive layer is disposed within the dielectric layer and extends between the first surface and the second surface of the dielectric layer. The first conductive layer has a width ranging from about 2 μm to about 8 μm. The electronic component has a terminal electrically connected to the first conductive layer.

In one or more embodiments, a semiconductor device package includes a substrate, a dielectric layer disposed on the substrate, a first conductive layer penetrating the dielectric layer, an electronic component disposed over the dielectric layer, and a grounding structure disposed within the dielectric layer and adjacent to the first conductive layer. The dielectric layer has a first surface and a second surface opposite the first surface. The first conductive layer has a first portion and a second portion connected to the first portion. The first portion has a width greater than that of the second portion. The electronic component is electrically connected to the first conductive layer.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 7C illustrates one or more stages of a method of manufacturing a semiconductor device package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
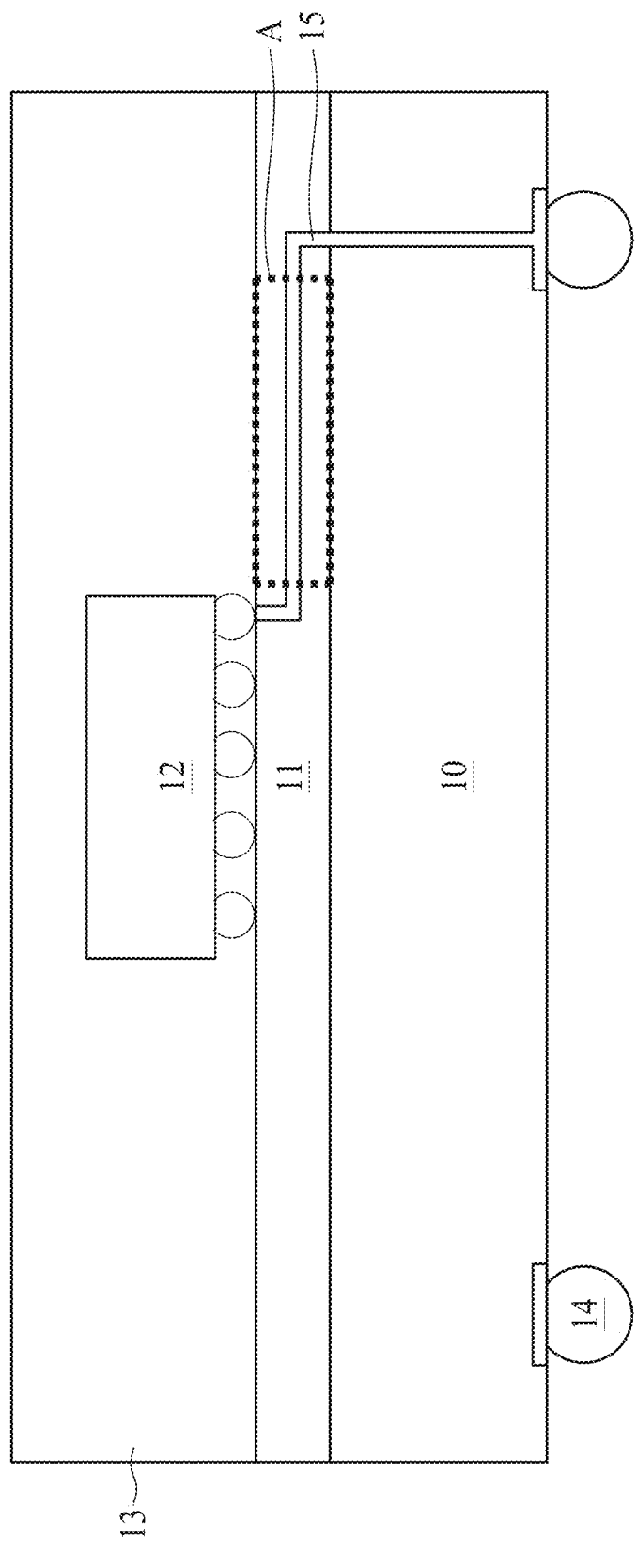
FIG. 1 illustrates a side view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a side view of a semiconductor device package 1 in accordance with some embodiments of the present disclosure.

The semiconductor device package 1 includes a substrate 10, a dielectric layer 11, an electronic component 12, an encapsulation layer 13, an electrical contact 14, and a conductive structure 15.

The substrate 10 may be, or include, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element.

The dielectric layer 11 is disposed over the substrate 10. The dielectric layer 11 may include an organic material, a solder mask, a polyimide (PI), an Ajinomoto build-up film (ABF), one or more molding compounds, one or more pre-impregnated composite fibers (e.g., a pre-preg material), a borophosphosilicate glass (BPSG), a silicon oxide, a silicon nitride, a silicon oxynitride, an undoped silicate glass (USG), any combination thereof, or the like. In some embodiments, the L/S width of the substrate 10 may equal to or larger than 10 µm/10 µm.

The conductive structure 15 is disposed in the dielectric layer 10 and electrically connects the electronic component 12 to the electrical contacts 14. The conductive structure 15 is or includes a redistribution layer (RDL). In some embodiments, the conductive structure 15 and the dielectric layer 11 may be collectively referred to as an interconnection layer to provide electrical connections between the electronic component 12 and the substrate 10. In some embodiments, the interconnection layer includes a fan-out structure. The conductive structure 15 may include, for example, gold (Au), silver (Ag), copper (Cu), nickel (Ni), palladium (Pd), another metal, a solder alloy, or a combination of two or more thereof. The conductive structure 15 may have a L/S width equal to or less than 5 µm/5 µm, such as, equal to or less than 2 µm/5 µm, or equal to or less than 2 µm/2 µm.

The electronic component 12 is disposed on a surface of the dielectric layer 11 facing away from the substrate 10. The electronic component 12 may include, for example, a chip or a die including a semiconductor substrate. The electronic component 12 may include one or more integrated circuit devices and one or more overlying interconnection structures. The integrated circuit devices may include active devices such as transistors and/or passive devices such as resistors, capacitors, inductors, or a combination thereof. The electronic component 12 may include one or more terminals (not shown in the figures) electrically connected to the conductive structure 15. In some embodiments, there may be any number of electronic components 12 depending on design specifications.

The encapsulation layer 13 is disposed on the dielectric layer 11 to cover or encapsulate the electronic component 12. The encapsulating layer 13 may include, for example, a molding compound, a PI, an epoxy-based material, a phenolic compound or material, a material with a silicone dispersed therein, or a combination thereof.

The electrical contacts 14 are disposed on a surface of the substrate 10 facing away from the dielectric layer 11 and can provide electrical connections between the semiconductor device package 1 and external components (e.g. external circuits or circuit boards). The electrical contacts 14 (e.g. solder balls) may include a controlled collapse chip connection (C4) bump, a ball grid array (BGA) or a land grid array (LGA). In some embodiments, the electrical contacts 14 can be used for a fan-in structure, a fan-out structure, or a combination of the fan-in and fan-out structure. In some embodiments, there may be any number of electrical contacts 14 depending on design specifications.

Figure 2A:
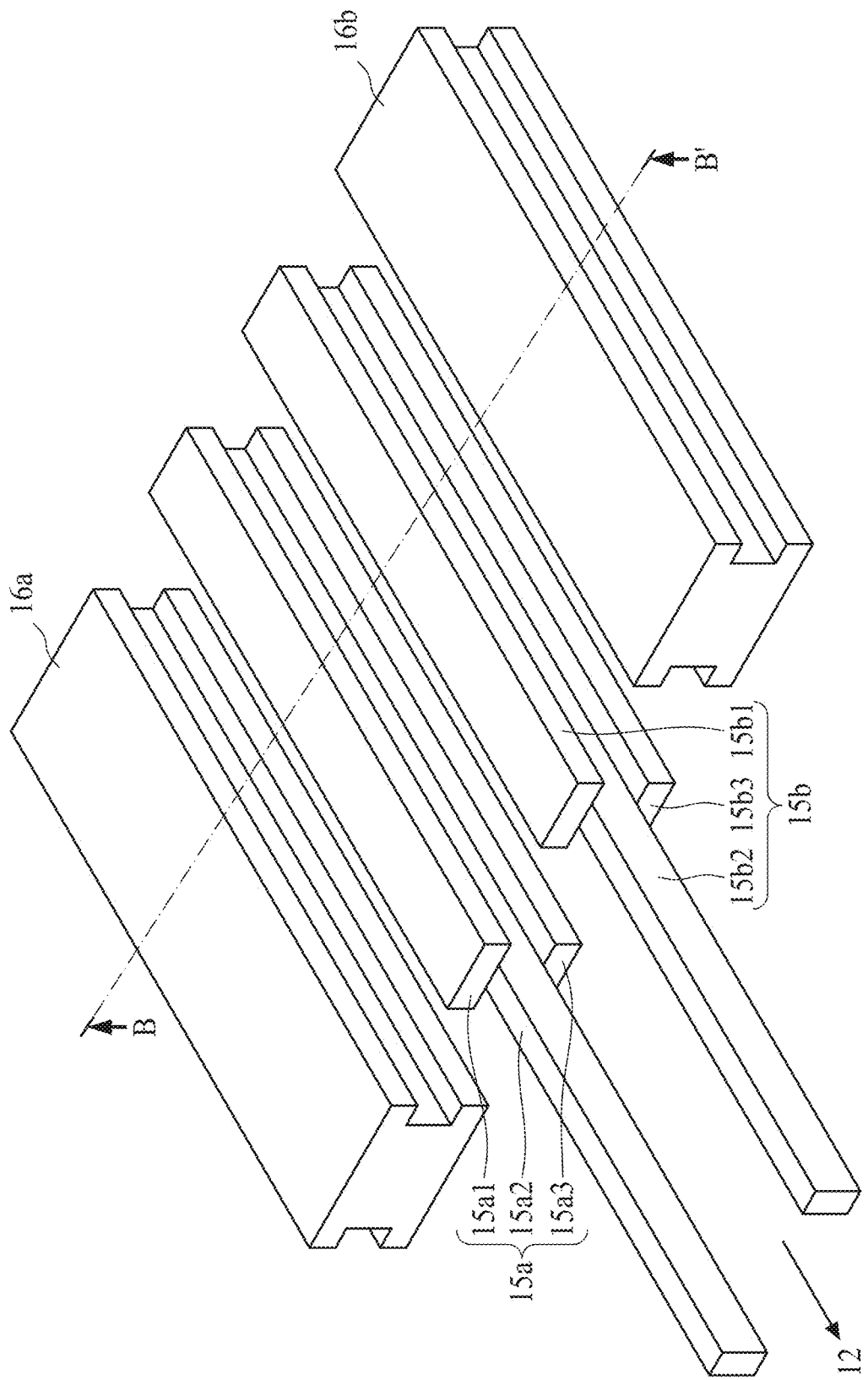
FIG. 2A illustrates a perspective view of a part of a semiconductor device package in accordance with some embodiments of the present disclosure.
Figure 2B:
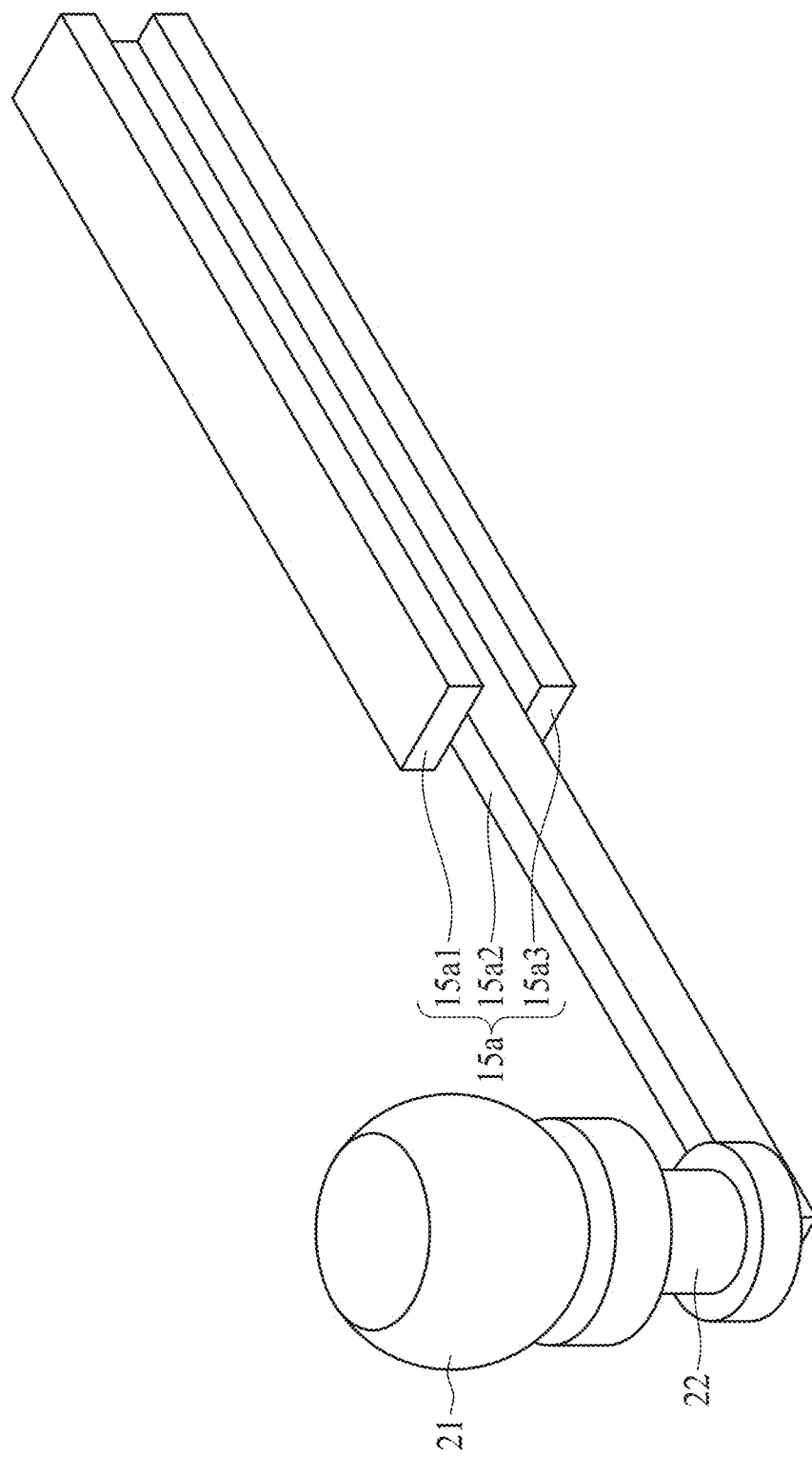
FIG. 2B illustrates a perspective view of a part of a semiconductor device package in accordance with some embodiments of the present disclosure.
Figure 3:
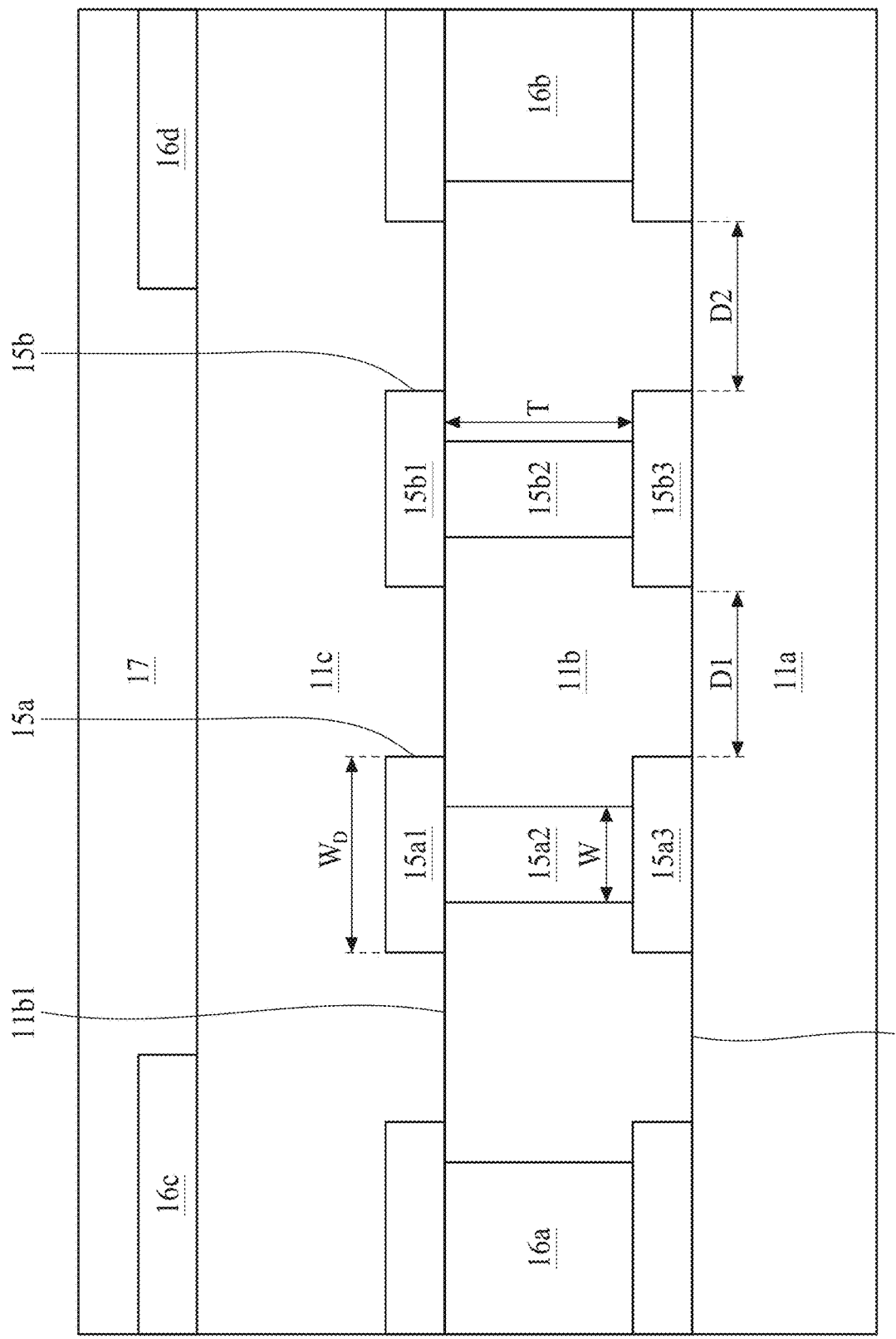
FIG. 3 illustrates a cross-sectional view of a part of a semiconductor device package in accordance with some embodiments of the present disclosure.

FIG. 2A illustrates a perspective view of a part of a semiconductor device package (or a perspective view of a portion in the dotted box A as shown in FIG. 1) in accordance with some embodiments of the present disclosure. For example, FIG. 2A illustrates a perspective view of a part of the interconnection layer in accordance with some embodiments of the present disclosure. FIG. 2B illustrates a perspective view of a part of a semiconductor device package (or a perspective view of a portion in the dotted box A as shown in FIG. 1) in accordance with some embodiments of the present disclosure. For example, FIG. 2B illustrates a perspective view of a part of the interconnection layer in accordance with some embodiments of the present disclosure. FIG. 3 illustrates a cross-sectional view of a part of a semiconductor device package (or a cross-sectional view along line BB' as shown in FIG. 2A) in accordance with some embodiments of the present disclosure. For example, FIG. 3 illustrates a cross-sectional view of a part of the interconnection layer in accordance with some embodiments of the present disclosure.

Referring to FIG. 2A, the conductive structure 15 may include conductive layers 15a and 15b, and grounding structures 16a and 16b disposed in a dielectric layer (such as the dielectric layer 11 in FIG. 1, or the dielectric layers 11a, 11b, and 11c in FIG. 3).

Each of the conductive layers 15a and 15b may have the same materials as listed above for the conductive structure 15 in FIG. 1. The conductive layer 15a has portions 15a1, 15a2, and 15a3. The portions 15a1, 15a2, and 15a3 are physically connected. A part of the portion 15a2 is disposed between the portions 15a1 and 15a3, while the other part is exposed from or spaced apart from the portions 15a1 and 15a3. For examples, the portion 15a2 is partially disposed between the portions 15a1 and 15a3. For examples, the projection area of the portions 15a1 and 15a3 on the surface of the dielectric layer 11a, 11b or 11c is overlapped with a part of the projection area of the portion 15a2 on the surface of the dielectric layer 11a, 11b or 11c. For examples, a part of the portion 15a2 is sandwiched between and in contact with the portions 15a1 and 15a3, while the other part of the portion 15a2 is protruded from the portions 15a1 and 15a3 along the arrow directing to item label "12" as denoted in FIG. 2A. For examples, a part of the portion 15a2 is extended longer than the portions 15a1 and 15a3 along the arrow directing to item label "12" as denoted in FIG. 2A and FIG. 2B. The portions 15a1, 15a2, and 15a3 may have different widths measured along the line BB', which will be further discussed with respect to FIG. 3. The conductive layer 15b is disposed adjacent to the conductive layer 15a and spaced apart from the conductive layer 15a. The conductive layer 15b may have the same structure as the conductive layer 15a, and the descriptions of the conductive layer 15a may be applicable to the conductive layer 15b. In some embodiments, the conductive layers 15a and 15b are connected to the electronic component 12 and configured to transmit differential signals (or a differential pair of signals) from/to the electronic component 12. For examples, the conductive layers 15a and 15b transmit signal from/to the electronic component 12 using two complementary signals. In some embodiments, the conductive layers 15a and 15b may be or may include transmission lines.

The portion 15a2 protruding from the portions 15a1 and 15a3 connects with a terminal of the electronic component 12. Therefore, the electronic component 12 is firstly connected to the protruded part of the conductive layer 15a with a smaller cross-sectional area (e.g., the portion 15a2 has a smaller cross-sectional area), than the protruded part is connected to the portion 15a2 disposed between the portions 15a1 and 15a3 (e.g., the portions 15a1, 15a2, and 15a3 collectively have a larger cross-sectional area). In other words, the electronic component 12 is firstly electrically connected to a part of the conductive layer 15a having a smaller cross-sectional area (such as a cross-sectional area ranges from about 1.5 μm² to about 24.0 μm²) and then electrically connected to a part of the conductive layer 15a having a larger cross-sectional area (such as a cross-sectional area ranges from about 18.0 μm² to about 80.0 μm²).

In some embodiments, as shown in FIG. 2B, the electronic component 12 may be connected to the protruded part of the conductive layer 15a through an electronic contact 21 and a conductive via 22. For example, the protruded part of the conductive layer 15a is electrically connected to one of the pins or terminals of the electronic component 12 through the electronic contact and the conductive via 22.

As the functionality of the electronic component 12 increases, the number of the pins of the electronic component 12 (or the density of the pins of the electronic component 12) increases as well. Connecting the pins of the electronic component 12 with the part of the conductive layer 15a having a relatively smaller pitch can facilitate the connection between the electronic component 12 and the conductive layer 15a.

Figure 8:
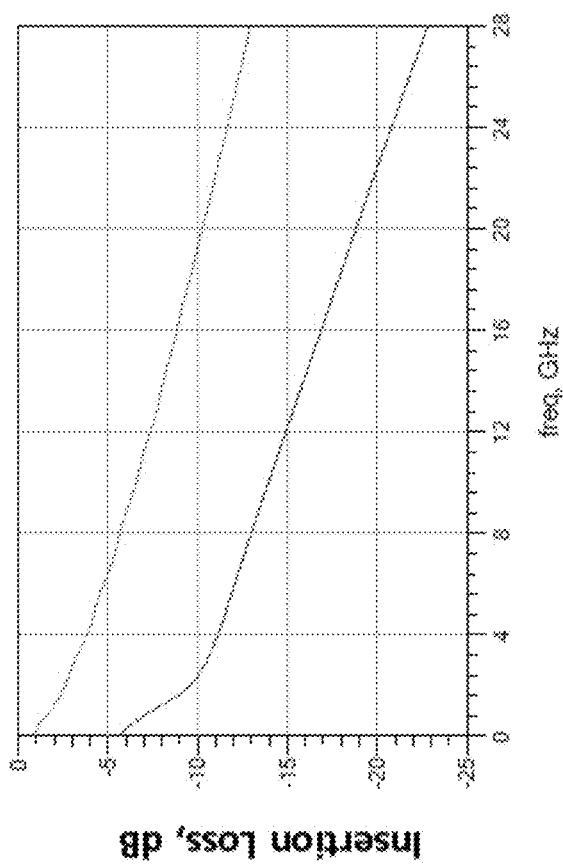
FIG. 8 illustrates simulation results showing insertion loss versus frequency in accordance with some embodiments of the present disclosure.
Figure 9:
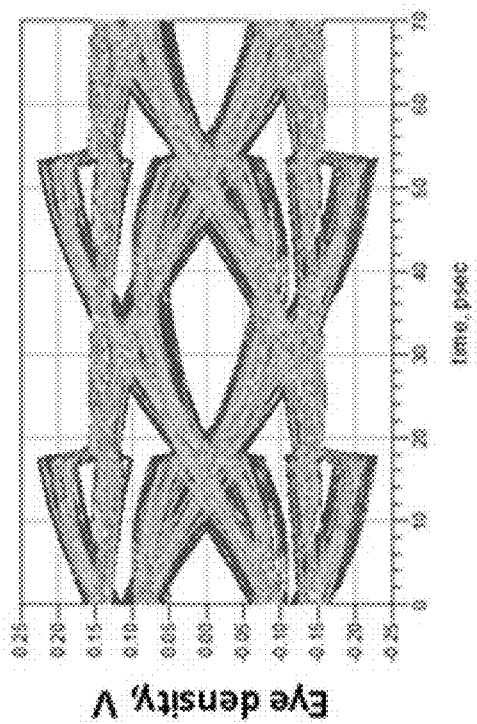
FIG. 9 illustrates eye diagrams in accordance with some embodiments of the present disclosure.
Figure 9:
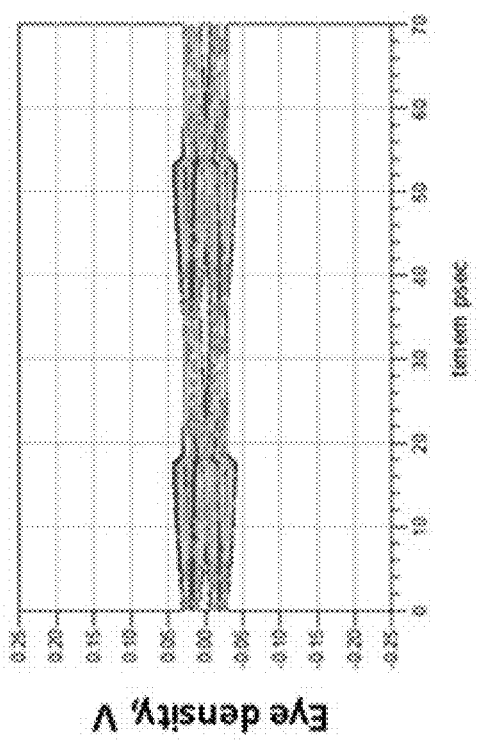

With the redesign of circuit layout helping enlarge the total cross-sectional area of the conductive layer 15a, the conduction loss thereof can be reduced without compromising the L/S width. For examples, as shown in the plot of FIG. 8, compared with the comparative fan-out structure (the lower line), the DC insertion loss of the conductive layer 15a and 15b can be reduced from up to about −6.5 dB to about −0.67 dB (the upper line). In addition, by using the conductive layer 15a with the portions 15a1 and 15a3 to transmit signal, a better eye diagram performance (as shown in the right eye diagram of FIG. 9) and higher reliability of the signal can be obtained compared with the comparative fan-out structure (as shown in the left eye diagram of FIG. 9).

In some embodiments, one end of the portion 15a2 may be directly connected to a terminal of the electronic component 12. In some embodiments, one end of the portion 15a2 may be indirectly connected to a terminal of the electronic component 12 through other interconnection structure(s), such as a via (such as the conductive via 22 in FIG. 2B), a trace, and/or another conductive layer.

Still referring to FIG. 2A, the grounding structures 16a and 16b disposed adjacent to the conductive layers 15a and 15b, respectively. The grounding structures 16a and 16b may be used to provide an electromagnetic interference (EMI) protection for the conductive layers 15a and 15b, such as rejecting crosstalk from another conductive circuit or channel, and vice versa. In some embodiments, the grounding structures 16a and 16b are disposed adjacent to parts of the conductive layers 15a and 15b having a larger cross-sectional area, and are not adjacent to the protruded part of the conductive layer 15a.

Referring to FIG. 3, the interconnection structure may include the dielectric layers 11a, 11b, and 11c, the conductive layers 15a and 15b, the grounding structures 16a, 16b, 16c, and 16d, and a metallic layer 17.

As shown in FIG. 3, the dielectric layer 11b has a surface 11b1 and a surface 11b2 opposite to the surface 11b1. The dielectric layer 11a is in contact with the surface 11b2 of the dielectric layer 11b. The dielectric layer 11c is in contact with the surface 11b1 of the dielectric layer 11b. The metallic layer 17 is disposed on a surface of the dielectric layer 11c facing away from the dielectric layer 11b. In some embodiments, a conductive via (such as the conductive via 22 in FIG. 2B) may be formed in the metallic layer 17 to connect the conductive layers 15a and 15b to an electronic component (such as the electronic component 12 in FIG. 1).

The portion 15a3 of the conductive layer 15a is disposed within the dielectric layer 11b. The portion 15a3 of the conductive layer 15a is disposed on the dielectric layer 11a. The portion 15a3 of the conductive layer 15a is adjacent to the surface 11b2 of the dielectric layer 11b. A surface of the portion 15a3 of the conductive layer 15a is substantially coplanar with the surface 11b2 of the dielectric layer 11b.

The portion 15a2 of the conductive layer 15a is disposed within the dielectric layer 11b. The portion 15a2 of the conductive layer 15a is disposed on the portion 15a3 of the conductive layer 15a. A surface of the portion 15a2 of the conductive layer 15a is substantially coplanar with the surface 11b1 of the dielectric layer 11b.

The portion 15a1 of the conductive layer 15a is disposed on the portion 15a2 of the conductive layer 15a. The portion 15a1 of the conductive layer 15a is exposed form the dielectric layer 11b. The portion 15a1 of the conductive layer 15a is disposed within the dielectric layer 11c. The portion 15a1 of the conductive layer 15a is disposed on the surface 11b1 of the dielectric layer 11b. A surface of the portion 15a1 of the conductive layer 15a is substantially coplanar with the surface 11b1 of the dielectric layer 11b.

The portions 15a1 and 15a3 are disposed on opposing sides of the portion 15a2. In other words, the portion 15a1 and the portion 15a2 are connected to opposing sides of the portion 15a2. In some embodiments, the portions 15a1 and 15a3 are disposed on opposite sides of the portion 15a2 symmetrically.

In some embodiments, the width (W) of the portion 15a2 may be different from the width (WD) of the portions 15a1. For examples, the width (W) of the portion 15a2 may be less than the width (WD) of the portions 15a1. The width (WD) of the portions 15a1 may be greater than the width (W) of the portion 15a2. In some embodiments, the ratio of the width (WD) to the width (W) may be about 1.5 to about 4.0. In some embodiments, the width (W) of the portion 15a2 may range from about 0.5 μm to about 10.0 μm, such as from about 2.0 μm to about 5.3 μm. In some embodiments, the width of the portion 15a3 may be substantially the same as the width (WD) of the portions 15a1. In some embodiments, the ratio of the height (T) to the width (W) may be equal to or less than about 1.5. In some embodiments, the total height of the conductive layer 15a may be about 10 μm to about 20 μm. In some embodiments, the conductive layer 15b may have the same dimensions as the conductive layer 15a as described above.

The conductive layers 15a and 15b may be spaced apart from each other by a distance (D1) ranging from about 8.0 μm to about 12.0 μm. The conductive layer 15b and the grounding structure 16b may be spaced apart from each other by a distance (D2) about 10.0 μm. The conductive layer 15a and the grounding structure 16a may be spaced apart from each other by a distance about 10.0 μm.

The distance (D1) between the conductive layers 15a and 15b can be used for impedance control. There is a tradeoff between the impedance control and the DC insertion loss. For examples, when it comes to a less DC insertion loss, the distance (D1) between the conductive layers 15a and 15b is chose to be about 8.0 μm, which implies a poor impedance control than 12.0 μm.

Still referring to FIG. 3, the grounding structure 16a is disposed in the dielectric layer 11b and adjacent to the conductive layer 15a. The grounding structure 16b is disposed in the dielectric layer 11b and adjacent to the conductive layer 15b. The grounding structure 16c is disposed on the dielectric layer 11c. The grounding structure 16d is disposed on the dielectric layer 11c. In some embodiments, the grounding structures 16a and 16b may be disposed above and/or below the conductive layers 15a and 15b. For examples, the grounding structure 16a may be disposed in the dielectric layer 11c, and the grounding structure 16b may be disposed in the dielectric layer 11a. However, the total thickness of the dielectric layer 11 may be larger, in comparison with the configuration that the grounding structures 16a and 16b are disposed in the dielectric layer 11b and adjacent to the conductive layers 15a and 15b.

In some embodiments, the grounding structures 16a, 16b, 16c, and 16d may include metal (such as Au, Ag, Cu, aluminum (Al), chromium (Cr), tin (Sn), nickel (Ni)), an alloy, or other combination thereof. In some embodiments, the number and the arrangement of the grounding structures can be adjusted or changed depending on different design specifications. Although the grounding structures 16a and 16b illustrated in FIG. 3 have a central part disposed between two side parts, and the central part has a less width than that of the side parts; it is not intended to limit the present disclosure. For examples, the grounding structures 16a and 16b may take the form of a wall having a constant width.

Figure 4:
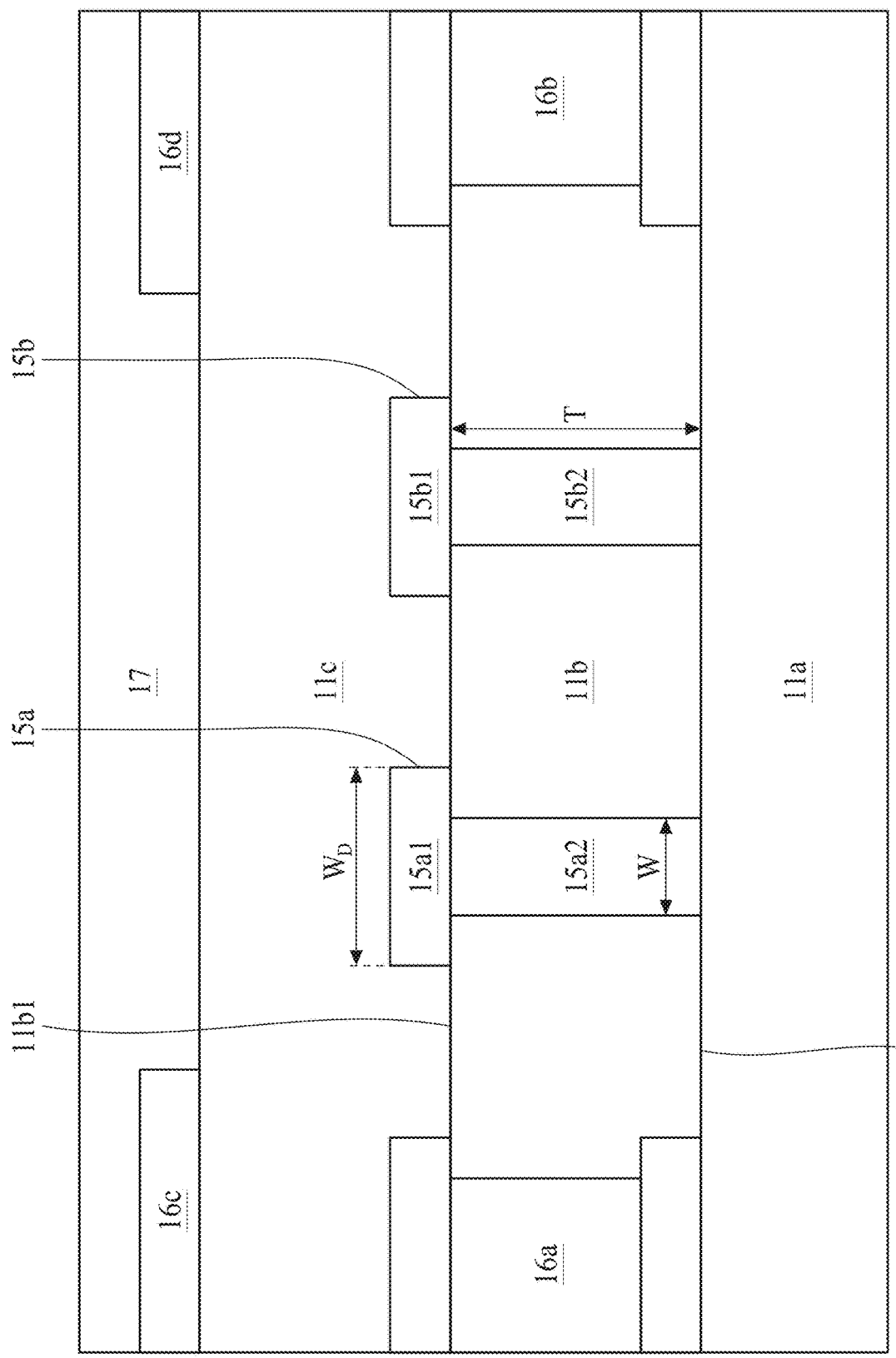
FIG. 4 illustrates a cross-sectional view of a part of a semiconductor device package in accordance with some embodiments of the present disclosure.

FIG. 4 illustrates a cross-sectional view of a part of a semiconductor device package in accordance with some embodiments of the present disclosure. The structure in FIG. 4 is similar to the structure in FIG. 3, and the differences therebetween are described below.

The conductive layer 15a in FIG. 4 has the portion 15a1 and the portion 15a2. The portion 15a2 penetrates from the surface 11b1 of the dielectric layer 11b to the surface 11b2 of the dielectric layer 11b. The portion 15a2 extends between the surface 11b1 of the dielectric layer 11b and the surface 11b2 of the dielectric layer 11b. Although the portion 15a3 is omitted in the conductive layer 15a in FIG. 4, the portion 15a2 is longer in FIG. 4 than in FIG. 3, so that the process operations may be reduced while keeping an acceptable cross-sectional area and DC insertion loss.

Figure 5:
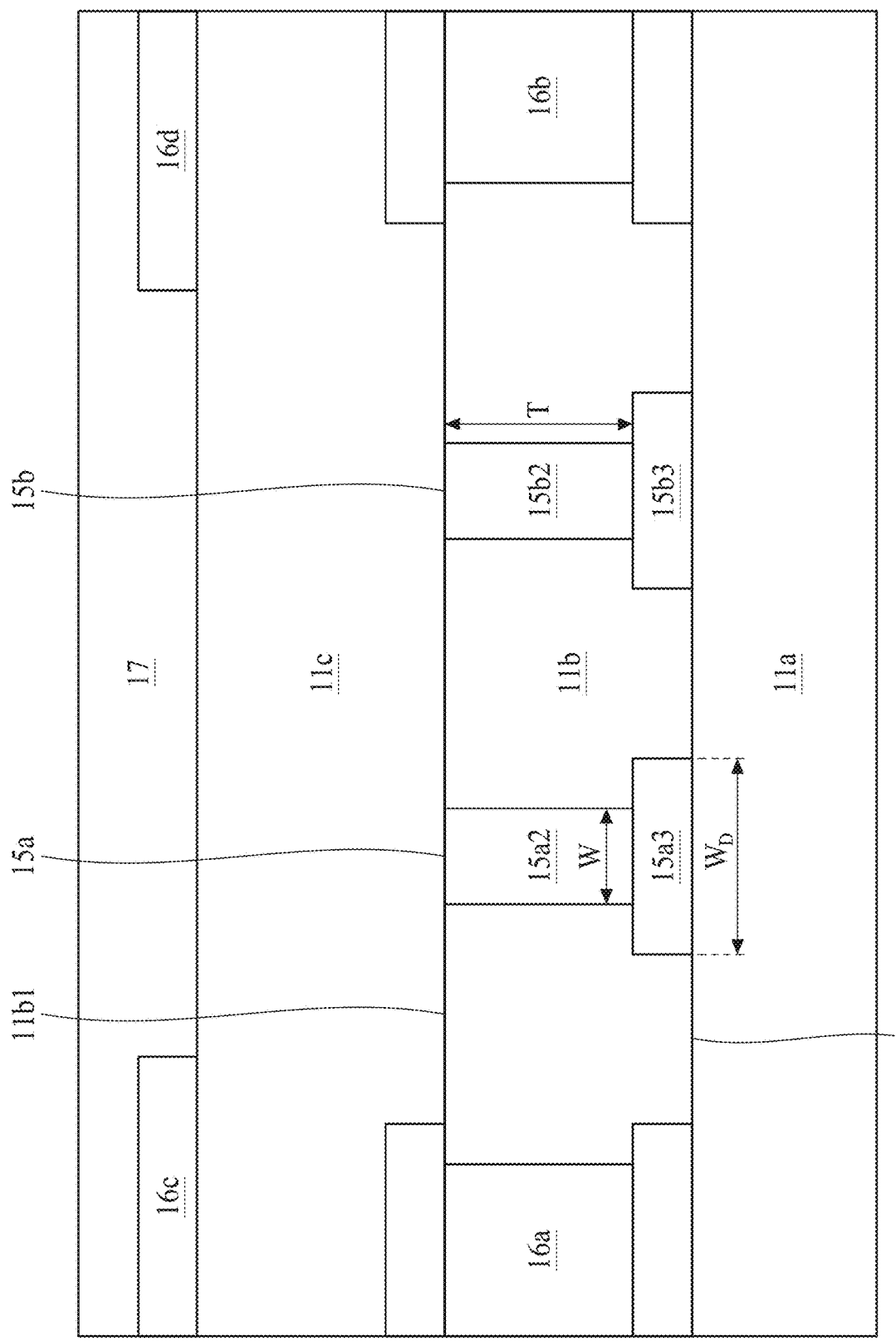
FIG. 5 illustrates a cross-sectional view of a part of a semiconductor device package in accordance with some embodiments of the present disclosure.

FIG. 5 illustrates a cross-sectional view of a part of a semiconductor device package in accordance with some embodiments of the present disclosure. The structure in FIG. 5 is similar to the structure in FIG. 3, and the differences therebetween are described below.

The conductive layer 15a in FIG. 5 has the portion 15a2 and the portion 15a3. The portion 15a1 is omitted in the conductive layer 15a in FIG. 5. In some embodiments, although the portion 15a1 is omitted, the portion 15a2 may be wider in FIG. 5 than in FIG. 3, so that the process operations may be reduced while keeping an acceptable cross-sectional area and DC insertion loss.

Figure 6:
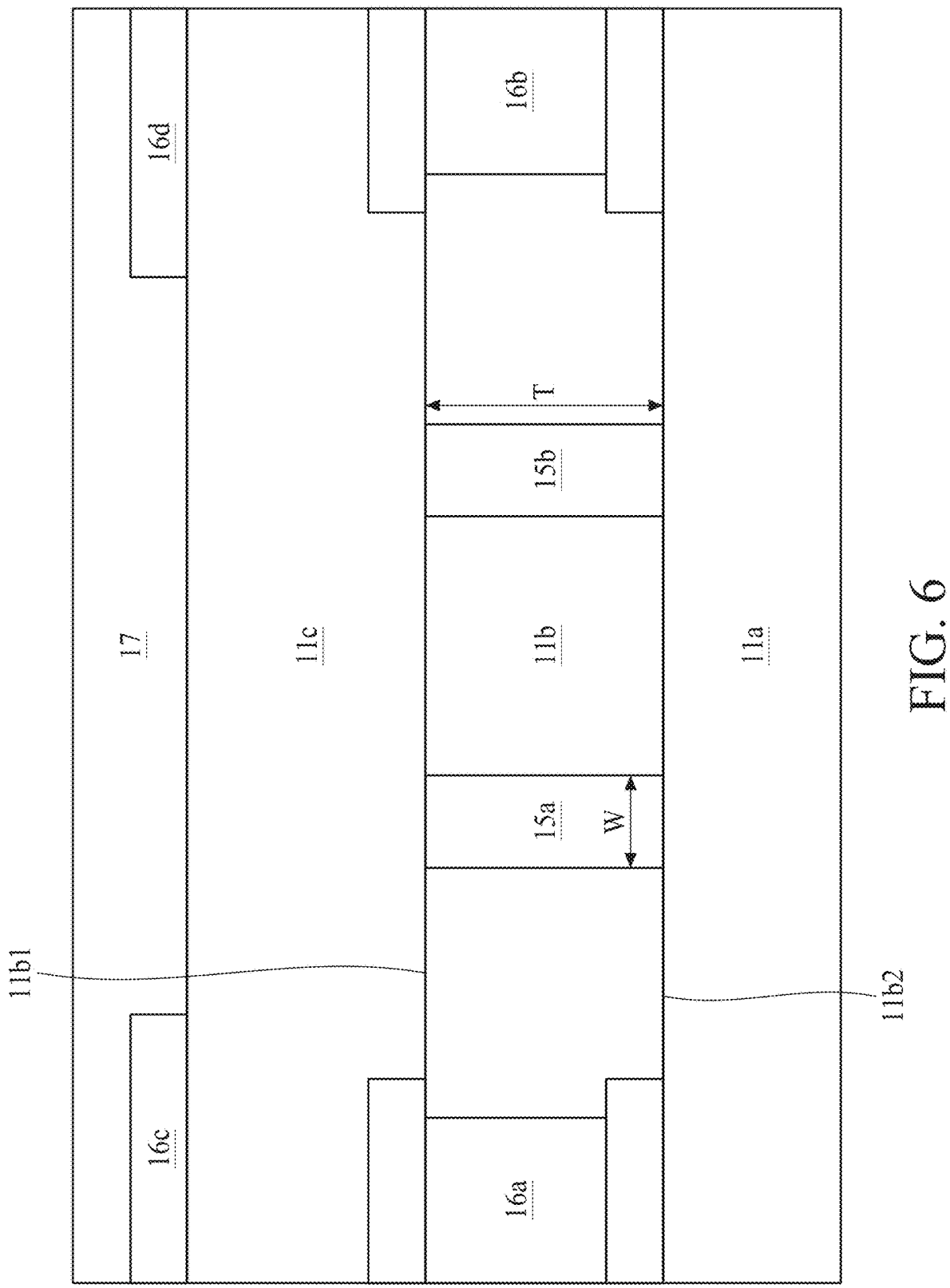
FIG. 6 illustrates a cross-sectional view of a part of a semiconductor device package in accordance with some embodiments of the present disclosure.

FIG. 6 illustrates a cross-sectional view of a part of a semiconductor device package in accordance with some embodiments of the present disclosure. The structure in FIG. 6 is similar to the structure in FIG. 3, and the differences therebetween are described below.

The conductive layer 15a in FIG. 6 penetrates from the surface 11b1 of the dielectric layer 11b to the surface 11b2 of the dielectric layer 11b. The conductive layer 15a has a constant width. The portions 15a1 and 15a3 are omitted in the conductive layer 15a in FIG. 6. In some embodiments, although the portions 15a1 and 15a3 are omitted, the conductive layer 15a may be wider in FIG. 6 than in FIG. 3, so that the process operations may be reduced while keeping an acceptable cross-sectional area and DC insertion loss. In some embodiments, the electronic component 12 may be firstly connected to a part of the conductive layer 15a with a smaller cross-sectional area and then connected to a part of the conductive layer 15a having a larger cross-sectional area.

FIG. 7A, FIG. 7B, FIG. 7C, FIG. 7D, FIG. 7E, FIG. 7F, FIG. 7G, FIG. 7H, and FIG. 7I are cross-sectional views of a part of a semiconductor device package at various stages of fabrication, in accordance with some embodiments of the present disclosure. At least some of these figures have been simplified for a better understanding of the aspects of the present disclosure.

Figure 7A:
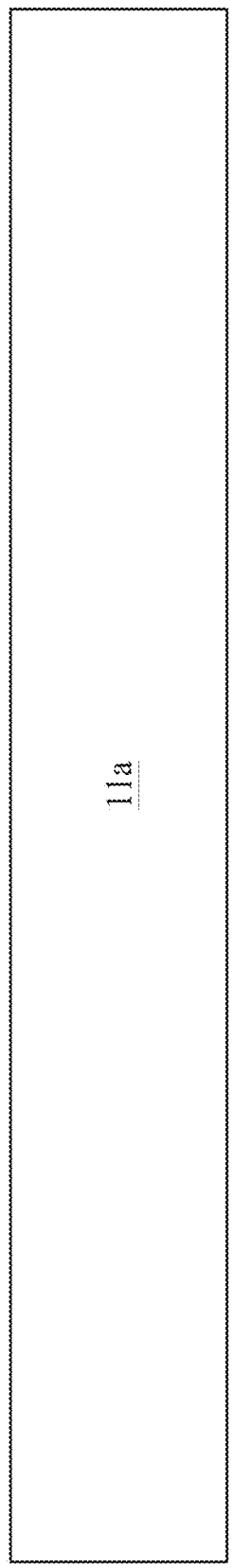
FIG. 7A illustrates one or more stages of a method of manufacturing a semiconductor device package in accordance with some embodiments of the present disclosure.

Referring to FIG. 7A, a dielectric layer 11a is provided. The dielectric layer 11a may be formed on a substrate (such as the substrate 10) by, for example, coating, lamination or other suitable processes.

Figure 7B:
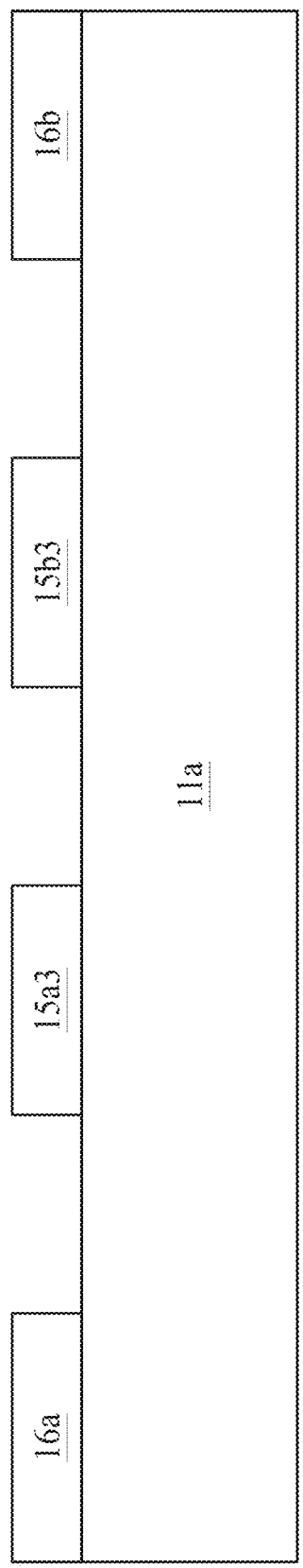
FIG. 7B illustrates one or more stages of a method of manufacturing a semiconductor device package in accordance with some embodiments of the present disclosure.

Referring to FIG. 7B, portions 15a3 and 15b3 of conductive layers and portions of grounding structures 16a and 16b are disposed on the dielectric layer 11a. The portions 15a3 and 15b3 and the grounding structures 16a and 16b may be formed by, for examples, coating a photoresist film (or a mask) on the dielectric layer 11a, patterning the mask by lithographic technique, depositing conductive material in the patterned mask, and removing the mask. The conductive materials may be deposited by sputtering, electroless plating, plating, printing, or other suitable processes. The mask may be removed by etching, stripping, or other suitable processes.

Referring to FIG. 7C, a dielectric layer 11b is provided on the dielectric layer 11a to cover or encapsulate the portions 15a3 and 15b3 and the grounding structures 16a and 16b.

Figure 7D:
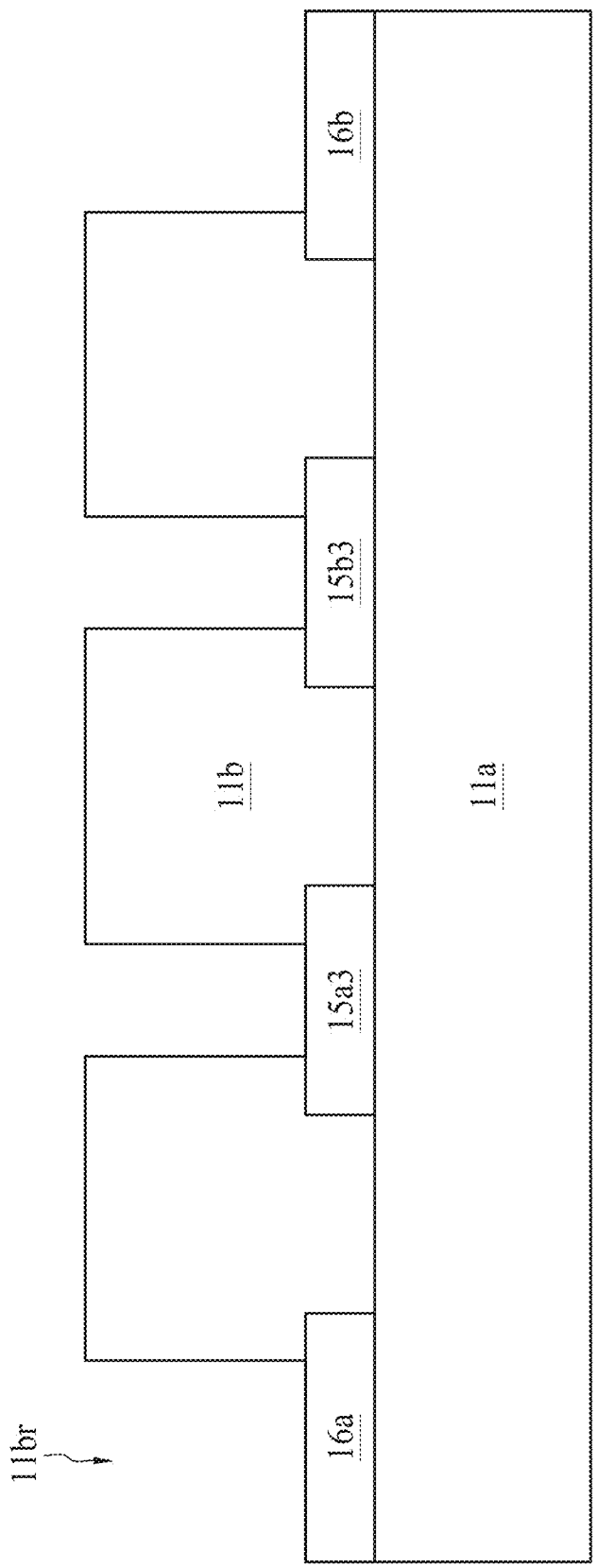
FIG. 7D illustrates one or more stages of a method of manufacturing a semiconductor device package in accordance with some embodiments of the present disclosure.

Referring to FIG. 7D, openings 11br are formed in the dielectric layer 11b by, for examples, laser drill to expose each of a part of the portions 15a3 and 15b3 and the grounding structures 16a and 16b.

Figure 7E:
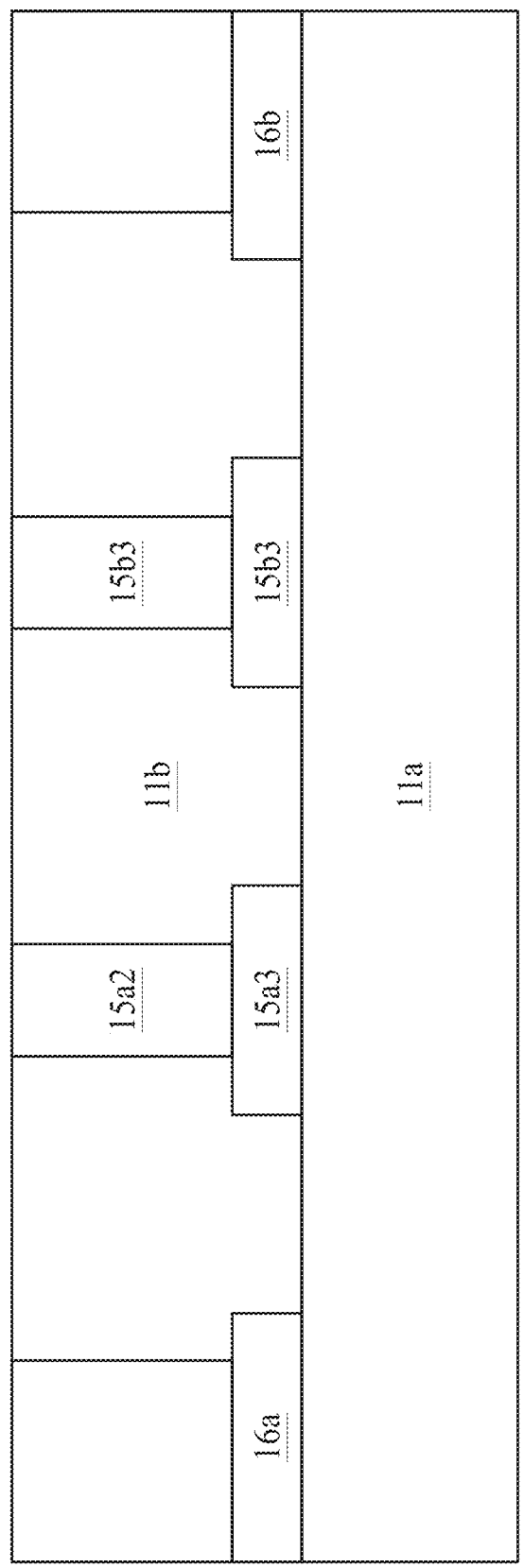
FIG. 7E illustrates one or more stages of a method of manufacturing a semiconductor device package in accordance with some embodiments of the present disclosure.

Referring to FIG. 7E, conductive material is deposited in the openings 11br in 7D on the exposed part of the portions 15a3 and 15b3 and the grounding structures 16a and 16b. Therefore, the portions 15a2 and 15b2 are formed in the openings.

Figure 7F:
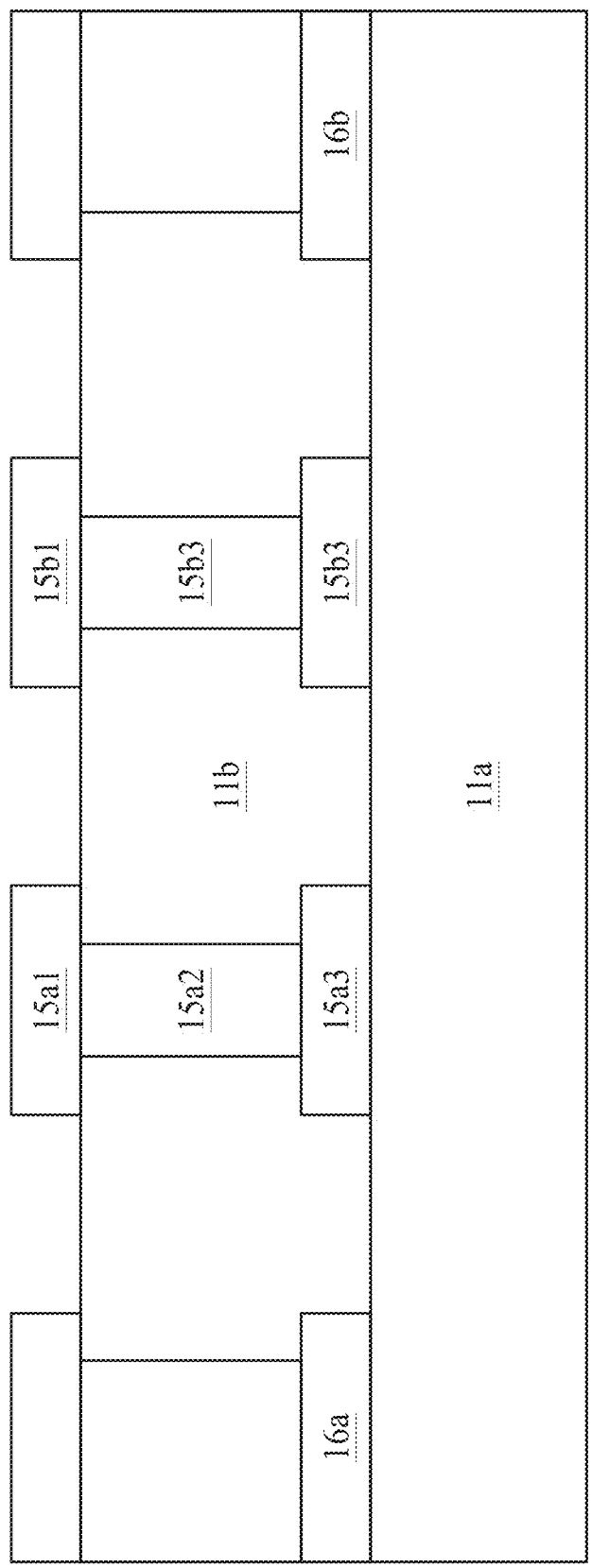
FIG. 7F illustrates one or more stages of a method of manufacturing a semiconductor device package in accordance with some embodiments of the present disclosure.

Referring to FIG. 7F, similar to the operations illustrated with respect to FIG. 7B, portions 15a1 and 15b1 of conductive layers and portions of the grounding structures 16a and 16b are disposed on the dielectric layer 11b.

Figure 7G:
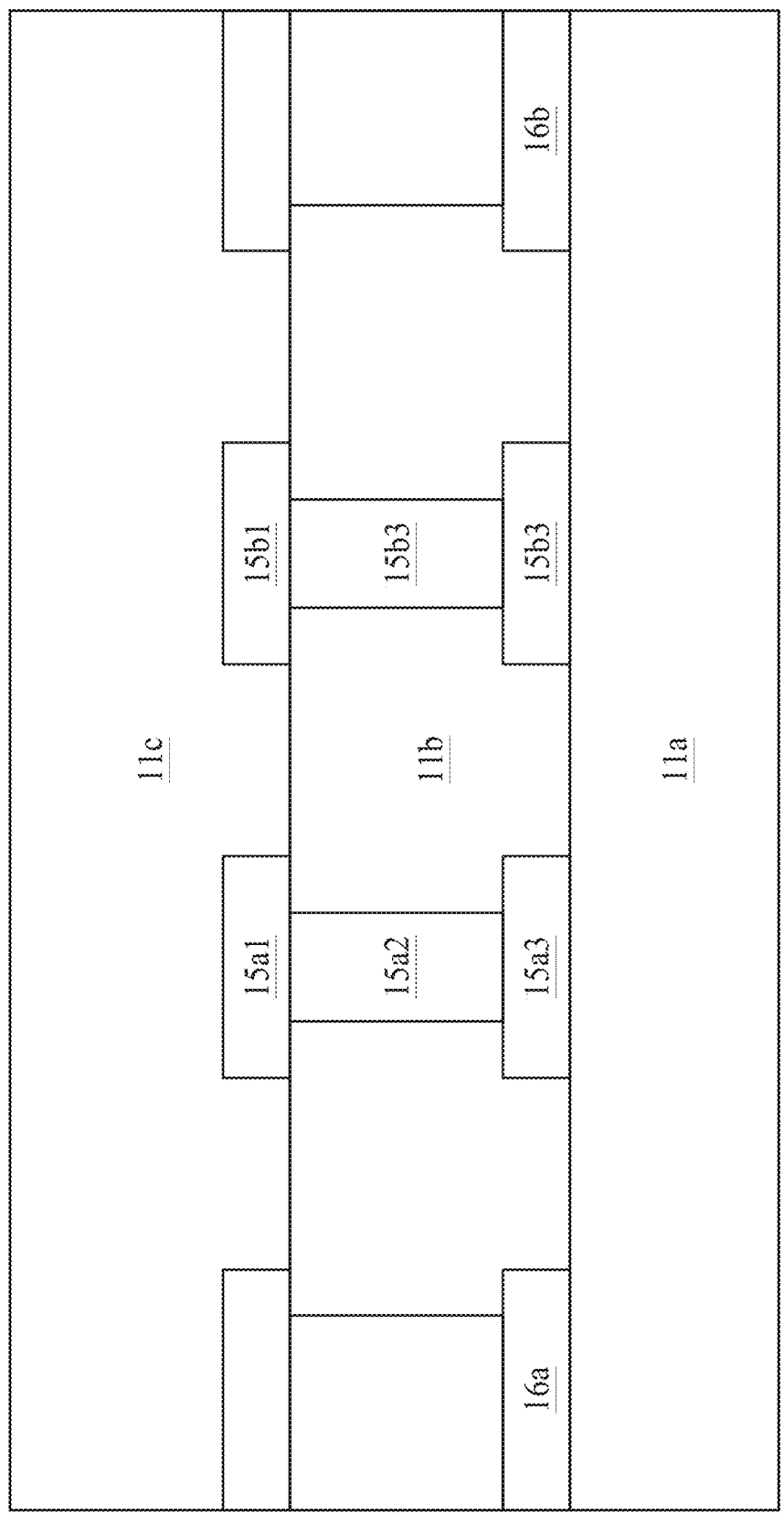
FIG. 7G illustrates one or more stages of a method of manufacturing a semiconductor device package in accordance with some embodiments of the present disclosure.

Referring to FIG. 7G, similar to the operations illustrated with respect to FIG. 7C, a dielectric layer 11c is provided on the dielectric layer 11b to cover or encapsulate the portions 15a1 and 15b1 and the exposed grounding structures 16a and 16b.

Figure 7H:
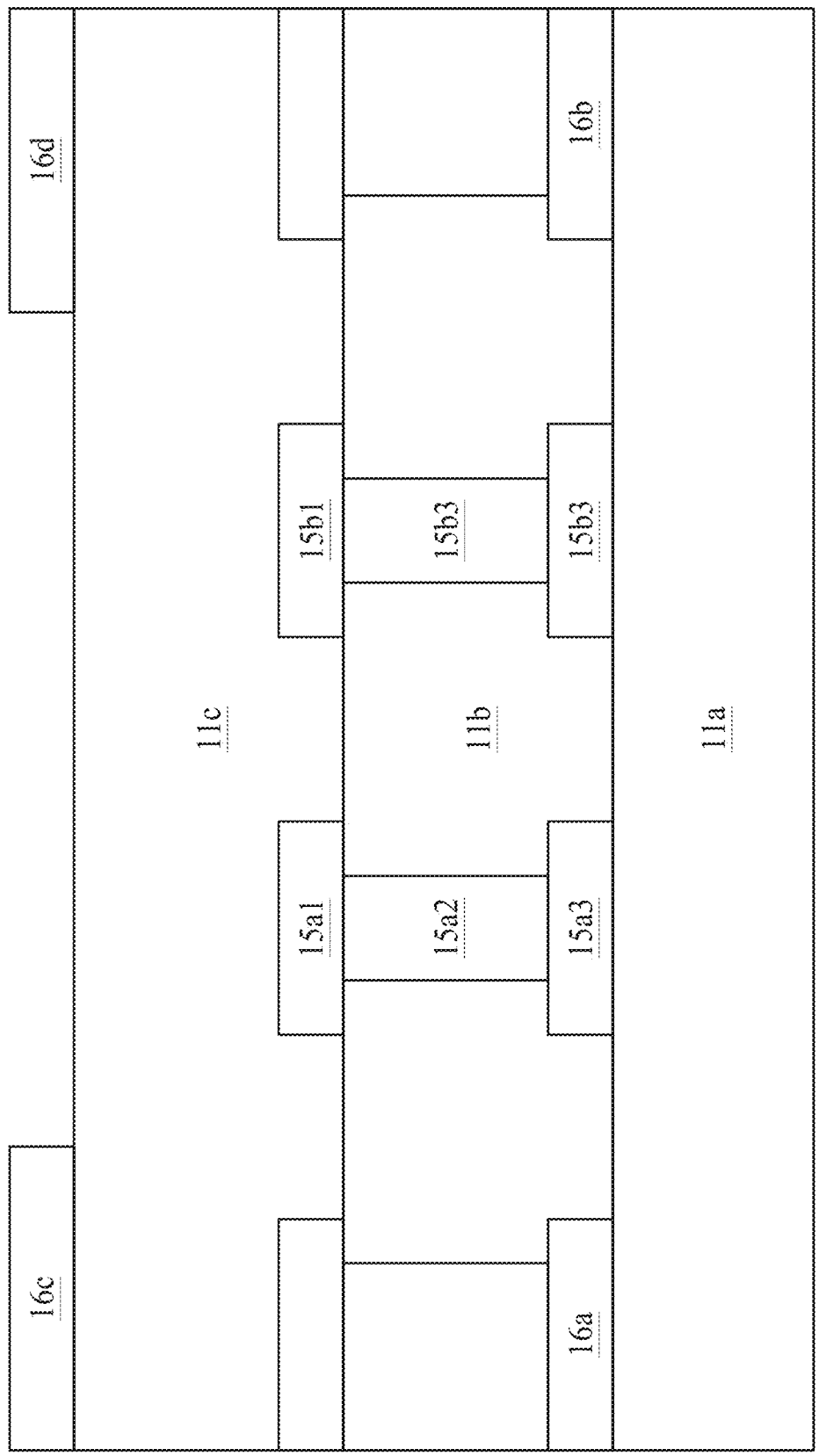
FIG. 7H illustrates one or more stages of a method of manufacturing a semiconductor device package in accordance with some embodiments of the present disclosure.

Referring to FIG. 7H, similar to the operations illustrated with respect to FIG. 7B, grounding structures 16c and 16d are disposed on the dielectric layer 11c.

Figure 7I:
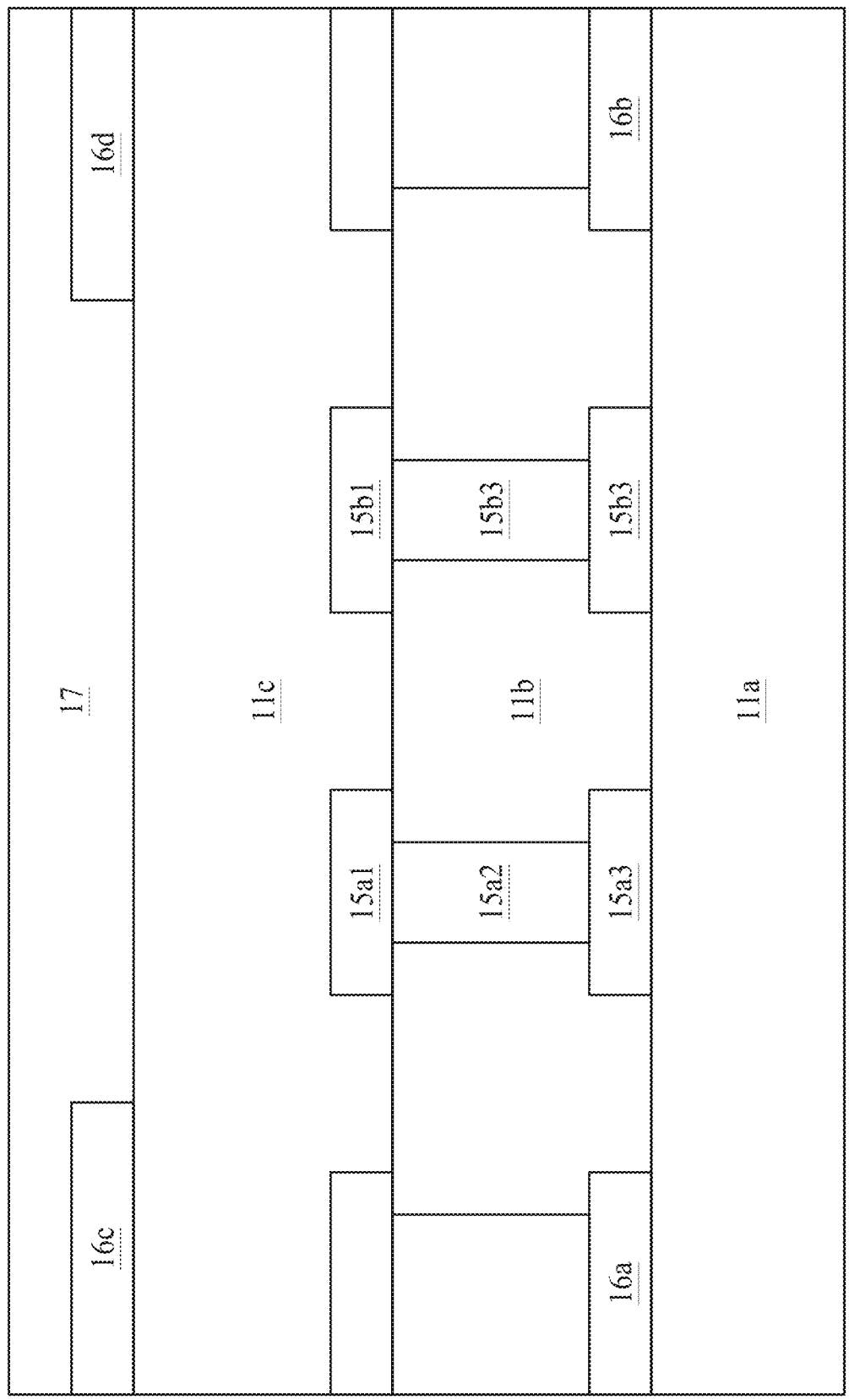
FIG. 7I illustrates one or more stages of a method of manufacturing a semiconductor device package in accordance with some embodiments of the present disclosure.

Referring to FIG. 7I, a metallic layer 17 is provided on the dielectric layer 11c to cover or encapsulate the grounding structures 16c and 16d.

In some embodiments, one or more electronic components (such as the electronic component 12 in FIG. 1) are disposed on a surface of the metallic layer 17 facing away from the dielectric layer 11c by a capillary or through other tools. In some embodiments, the electronic components may be disposed on an adhesive layer, glue or other intermediate layers for die-attaching. In some embodiments, an encapsulation layer (such as the encapsulation layer 13 in FIG. 1) is disposed on the metallic layer 17 to cover or encapsulate the electronic components. In some embodiments, the encapsulation layer may be formed by a molding technique, such as transfer molding or compression molding. In some embodiments, one or more electrical contacts (such as the electrical contacts 14 in FIG. 1) may be provided on a surface of the substrate (such as the substrate 10 in FIG. 1) facing away from the dielectric layer 11a. In some embodiments, singulation may be performed to separate individual semiconductor device packages. That is, the singulation is performed through the encapsulation layer and the substrate strip including the substrate. The singulation may be performed, for example, by using a dicing saw, laser or other appropriate cutting technique. After the singulation, the final structure may be similar to the semiconductor device package 1 as shown in FIG. 1.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
a dielectric layer having a first surface and a second surface opposite the first surface;
a first conductive layer penetrating the dielectric layer, the first conductive layer having a first portion and a second portion connected to the first portion, the first portion having a width greater than that of the second portion;
a grounding structure disposed within the dielectric layer and adjacent to the first conductive layer; and
an electronic component disposed over the dielectric layer, the electronic component having a terminal electrically connected to a part of the second portion of the first conductive layer that is spaced apart from the first portion of the first conductive layer.

2. The semiconductor device package as claimed in claim 1, wherein the second portion of the first conductive layer penetrating from the first surface of the dielectric layer to the second surface of the dielectric layer, and the first portion of the first conductive layer is exposed from the dielectric layer and disposed on the first surface of the dielectric layer.

3. The semiconductor device package as claimed in claim 1, wherein the first portion of the first conductive layer is disposed within the dielectric layer and adjacent to the second surface of the dielectric layer, and the second portion of the first conductive layer is disposed within the dielectric layer and on the first portion of the first conductive layer.

4. The semiconductor device package as claimed in claim 1, wherein the first conductive layer further includes a third portion connected to the second portion, the first portion and the third portion are connected to opposing sides of the second portion, and a width of the third portion is greater than that of the second portion.

5. The semiconductor device package as claimed in claim 4, wherein the first portion of the first conductive layer is exposed from the dielectric layer and disposed on the first surface of the dielectric layer, and the third portion is disposed within the dielectric layer and adjacent to the second surface of the dielectric layer.

6. The semiconductor device package as claimed in claim 1, further comprising:
a second conductive layer penetrating the dielectric layer, the second conductive layer disposed adjacent to the first conductive layer and spaced apart from the first conductive layer, the second conductive layer having a first portion and a second portion connected to the first portion, the first portion having a width greater than that of the second portion.

7. The semiconductor device package as claimed in claim 6, wherein the first conductive layer and the second conductive layer are configured to transmit differential signals.

8. The semiconductor device package as claimed in claim 1, wherein a ratio of the width of the first portion to the width of the second portion is about 1.5 to about 4.0.

9. The semiconductor device package as claimed in claim 1, wherein the grounding structure and the first conductive layer extend along an extending direction, and the grounding structure is shorter than the first conductive layer along the extending direction.

10. The semiconductor device package as claimed in claim 1, wherein a width of the first grounding structure is greater than the width of the first conductive layer.

11. A semiconductor device package, comprising:
a substrate;
a dielectric layer disposed on the substrate, the dielectric layer having a first surface and a second surface opposite the first surface;
a first conductive layer penetrating the dielectric layer, the first conductive layer having a first portion and a second portion connected to the first portion, the first portion having a width greater than that of the second portion;
an electronic component disposed over the dielectric layer and electrically connected to the first conductive layer;
a grounding structure disposed within the dielectric layer and adjacent to the first conductive layer; and
an electronic component disposed over the dielectric layer, the electronic component having a terminal electrically connected to a part of the second portion of the first conductive layer that is spaced apart from the first portion of the first conductive layer.

12. The semiconductor device package as claimed in claim 11, wherein the first conductive layer further includes a third portion connected to the second portion, the first portion and the third portion are connected to opposing sides of the second portion, and a width of the third portion is greater than that of the second portion.

13. The semiconductor device package as claimed in claim 12, wherein the first portion of the first conductive layer is exposed from the dielectric layer and disposed on the first surface of the dielectric layer, and the third portion is disposed within the dielectric layer and adjacent to the second surface of the dielectric layer.

14. The semiconductor device package as claimed in claim 11, further comprising:
a second conductive layer penetrating the dielectric layer, the second conductive layer disposed adjacent to the first conductive layer and spaced apart from the first conductive layer, the second conductive layer having a first portion and a second portion connected to the first portion, the first portion having a width greater than that of the second portion.

15. The semiconductor device package as claimed in claim 14, wherein the first conductive layer and the second conductive layer are configured to transmit differential signals.

16. The semiconductor device package as claimed in claim 11, wherein a ratio of the width of the first portion of the first conductive layer to the second portion of the first conductive layer is about 1.5 to about 4.0.

17. The semiconductor device package as claimed in claim 11, wherein the grounding structure and the first conductive layer extend along an extending direction, and the grounding structure is shorter than the first conductive layer along the extending direction.

18. The semiconductor device package as claimed in claim 11, wherein a width of the first grounding structure is greater than the width of the first conductive layer.

19. The semiconductor device package as claimed in claim 12, wherein the first grounding structure has a top portion disposed on the first surface of the dielectric layer and a bottom portion disposed within the dielectric layer, wherein a width of the top portion is greater than the width of the first portion or the width of the third portion, and a width of the bottom portion is greater than the width of the first portion or the width of the third portion.

* * * * *